US012768635B2

(12) United States Patent
Kernhof et al.

(10) Patent No.: US 12,768,635 B2
(45) Date of Patent: Oct. 20, 2026

(54) SIGNAL PROCESSING UNIT FOR INDUCTIVE POSITION SENSOR

(71) Applicant: RENESAS ELECTRONICS AMERICA INC., Milpitas, CA (US)

(72) Inventors: Jürgen Peter Kernhof, Bissingen (DE); Josef Janisch, Ilz (AT)

(73) Assignee: Renesas Electronics America Inc., San Jose, CA (US)

( * ) Notice: Subject to any disclaimer, the term of this patent is extended or adjusted under 35 U.S.C. 154(b) by 394 days.

(21) Appl. No.: 18/494,025

(22) Filed: Oct. 25, 2023

(65) Prior Publication Data

US 2024/0142215 A1 May 2, 2024

(30) Foreign Application Priority Data

Oct. 26, 2022 (EP) .................................... 22203883

(51) Int. Cl.
*G01B 7/00* (2006.01)
*H03M 1/10* (2006.01)
*H03M 1/12* (2006.01)

(52) U.S. Cl.
CPC .......... *G01B 7/003* (2013.01); *H03M 1/1014* (2013.01); *H03M 1/1215* (2013.01); *H03M 1/1255* (2013.01)

(58) Field of Classification Search
CPC . G01B 7/30; G01B 7/003; G01B 1/00; G01B 3/00; G01B 5/00; G01B 7/00; G01B 9/00; G01B 11/00; G01B 13/00; G01B 15/00; G01B 17/00; G01B 21/00; G01B 2210/00; G01B 2290/00; G01D 5/2046; G01D 3/08; G01D 5/204; G01D 5/2053; G01D 3/02; G01D 3/022; G01D 5/20; G01D 5/225; G01D 5/2275; G01D 5/2448; G01D 1/00; G01D 3/00; G01D 4/00; G01D 5/00; G01D 7/00; G01D 9/00; G01D 11/00; G01D 13/00; G01D 15/00; G01D 18/00; G01D 21/00; G01D 2204/00; G01D 2205/00; G01D 2207/00; G01D 2213/00; G01D 2218/00; G01D 5/145; G01D 5/2086; G01L 3/105; G01L 5/221; G01L 1/00; G01L 3/00; G01L 5/00; G01L 7/00; G01L 9/00; G01L 13/00; G01L 11/00; G01L 15/00; G01L 17/00; G01L 19/00;
(Continued)

(56) References Cited

U.S. PATENT DOCUMENTS 5,738,625 A * 4/1998 Gluck .................... A61N 2/006
128/897
9,995,778 B1 * 6/2018 Fiori, Jr. ............ G01R 27/2611
(Continued)

*Primary Examiner* — Daniel Previl
(74) *Attorney, Agent, or Firm* — SCULLY, SCOTT, MURPHY & PRESSER, P.C.

(57) ABSTRACT

A signal processing unit for an inductive position sensor is provided. The inductive position sensor provides a first position signal and a second phase-shifted position signal, such as, a sine position signal and a cosine position signal. The signal processing unit has an integrator for integrating an integer number of periods of the first position signal respectively an integer number of periods of the second phase-shifted position signal. The position of the moving target of the position sensor is calculated from the integrated first position signal and the integrated second phase-shifted position signal.

17 Claims, 13 Drawing Sheets

(58) Field of Classification Search

Figure 1:
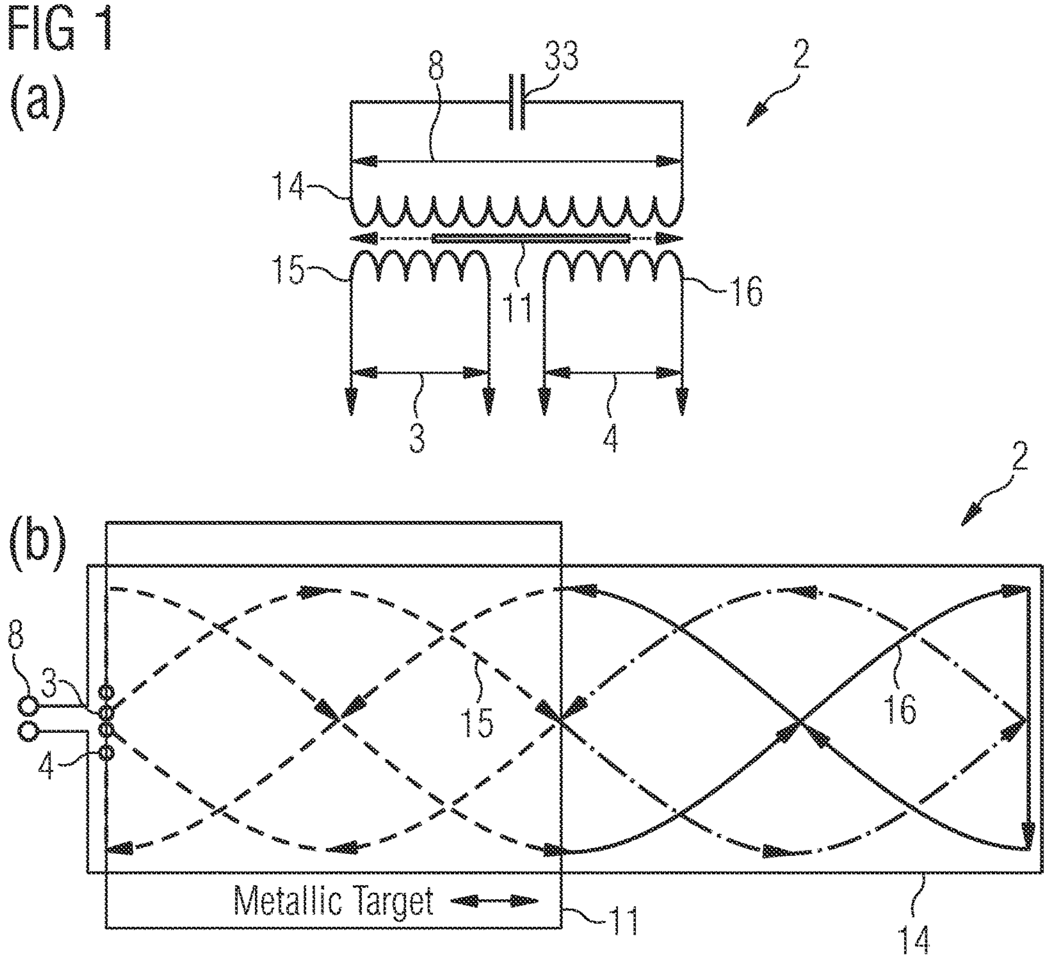

CPC ......... G01L 21/00; G01L 23/00; G01L 25/00; G01L 27/00; G03F 7/70141; G03F 7/70258; G03F 7/7085; G03F 1/00; G03F 3/00; G03F 5/00; G03F 7/00; G03F 9/00; H03M 1/1014; H03M 1/1215; H03M 1/1255; H03M 1/00; H03M 3/00; H03M 5/00; H03M 7/00; H03M 9/00; H03M 11/00; H03M 13/00; H03M 99/00; H04N 17/002; H04N 17/004; H04N 5/04; H04N 5/265; H04N 1/00; H04N 3/00; H04N 5/00; H04N 7/00; H04N 9/00; H04N 11/00; H04N 13/00; H04N 17/00; H04N 19/00; H04N 21/00; H04N 23/00; H04N 25/00; H04N 2101/00; H04N 2201/00; H04N 2209/00; H04N 2213/00; G06F 2203/04107; G06F 3/04166; G06F 3/0418; G06F 3/04182; G06F 3/044; G06F 3/0446; G06F 1/00; G06F 3/00; G06F 5/00; G05D 1/0287; G05D 2109/00; G05D 2107/00; G05D 2105/00; G05D 1/00; G05D 3/00; G05D 5/00; G05D 7/00; G05D 2111/00; G05D 2103/00; G07C 5/008; G07C 1/00; G07C 3/00; G07C 5/00; G07C 7/00; G07C 9/00; G07C 11/00; G07C 13/00; G07C 15/00; G07C 2205/00; G07C 2209/00; G08G 1/096716; G08G 1/096725; G08G 1/096775; G08G 1/164; G08G 1/205; G08G 1/00; G08G 3/00; G08G 5/00; G08G 7/00; G08G 9/00; G08G 99/00

USPC ........ 340/941, 943, 978, 992–994, 428–429, 340/426.25, 488, 517, 539.22, 566, 683, 340/691.8, 7.6

See application file for complete search history.

(56) References Cited

U.S. PATENT DOCUMENTS

| | | | | | |
|---|---|---|---|---|---|
| 10,527,457 | B2 | 1/2020 | Bruwer | | |
| 10,545,033 | B2 | 1/2020 | Hayashi | | |
| 2013/0181688 | A1* | 7/2013 | Tupper | H02P 9/02 | 322/61 |
| 2013/0257223 | A1* | 10/2013 | Kataoka | H10N 30/20 | 310/317 |
| 2018/0195881 | A1 | 7/2018 | Acker | | |
| 2018/0202835 | A1* | 7/2018 | Möller | G01B 7/003 | |
| 2022/0326002 | A1* | 10/2022 | Rasbornig | G01B 7/30 | |

* cited by examiner

LCO-to-Digital-Part synchronization scheme by SAR-ADC sample-&-hold

SIGNAL PROCESSING UNIT FOR INDUCTIVE POSITION SENSOR

CROSS-REFERENCE TO RELATED APPLICATION

This application claims priority under 35 U.S.C. § 119 to EPO Patent Application No. 22203883.8, filed on Oct. 26, 2022. The disclosure of EPO application, including the specification, drawings and abstract is incorporated herein by reference in its entirety.

BACKGROUND

The disclosure relates to a signal processing unit for an inductive position sensor, wherein the inductive position sensor provides a first position signal and a second phase-shifted position signal, particularly a sine position signal and a cosine position signal.

Many applications need position feedback of a moving target like a rotating member, for example in a throttle control for motor bicycles. In most cases, an additional position sensor is mounted to the moving part to generate the required position information. Magnetic position sensors and inductive position sensors are known. Since current carrying parts like motor cables or battery cables, a rotating motor package, the stator of the motor or additional equipment like a motor brake cause magnetic fields that may disturb magnetic fields, the use of inductive position sensors is preferred to provide robustness against such magnetic fields.

An inductive linear position or angle sensor is an apparatus based on the principle of magnetic induction for detecting the position or angle of a conductive (metallic) target. By using this principle of mechanically interacting with an electromagnetic field, a huge variety of sensors for several application in e.g., mechatronics, e-motors and object detections can be created. The essential advantage of this high reliable inductive sensing technique is the contact-free position detection of the conductive target.

There are disclosed techniques listed below.

[Patent Document 1] U.S. Pat. No. 4,853,604

[Patent Document 2] US Patent Application No. 2011/0101968

[Patent Document 3] U.S. Pat. No. 7,045,996

[Patent Document 4] U.S. Pat. No. 7,208,945

[Patent Document 5] US Patent Application No. 2008/0116883

Inductive position sensors implement a magnet-free technology, utilizing the physical principles of eddy currents or inductive coupling to detect the position of a target that is moving above a set of coils, consisting for example of one transmitter coil and two receiver coils, particularly a sine receiver coil and a cosine receiver coil. Such an inductive sensor system is for example disclosed in Patent Document 1.

In a practical implementation of the three coils, one transmitter coil and two receiver coils, are typically provided as copper traces on a printed circuit board (PCB), particularly a multi-layer PCB. They are arranged such that the transmitter coil induces a secondary voltage in the two receiver coils, which depends on the position of the conductive (metallic) target above the receiver coils. Therefore, the inductive sensor comprises or is connected to an oscillator that generates a radio-frequency signal, which is applied to the transmitter coil to create a static high frequency magnetic field. This static high frequency magnetic field is picked up by the receiver coils, particularly the sine receiver coil and the cosine receiver coil. Depending on the position of the conductive target above the coils, the secondary voltage picked up by the receiver coils is changing in amplitude, allowing the determination of the target's position by analysing this effect. For example, the target position is calculated by the arctangent of the momentary sine signal amplitude divided by the momentary cosine signal amplitude. The calculation is performed by a processing unit, which is connected to the position sensor or integral part of the position sensor.

The layout of the transmitter and two receiver coils can be easily adapted to the geometrically dimensions and shape of a mechatronic sub-system. This results in a high flexibility and versatility of this kind of inductive position sensors.

In order to process the receiver signals, a complex circuit containing a demodulator, a gain stage, offset and gain mismatch compensation, an analog-to-digital converter and a digital signal processing unit providing some form of arctangent calculation is necessary.

Patent Document 2 discloses an inductive position sensor for determining the position of a movable element. The position sensor comprises two subsystems, each having two transmitter units, an LC resonant circuit on the movable element and a receiver coil with an evaluation unit. The processing of the individual subsystems is carried out alternatively. Thus, if one subsystem is operating, all other subsystems are deactivated. The movable element including the LC resonant circuit rotates within a total electromagnetic field generated by the overlap of the two electromagnetic fields of the two transmitter units. In response, the LC resonant circuit will produce an electromagnetic field, which will be received by the receiver coil and the evaluation unit.

Patent Document 3 discloses a method for determining the position of a device including generating at least two, time-varying, magnetic fields using inductive elements, wherein the fields have different phases. The method further includes detecting a signal modulated on top of the fields, wherein the signal is generated from the device, and determining the position of the device based on a phase difference of the signal from the device and a reference signal. Like Patent Document 2, the disclosed method requires an LC resonant circuit on the moving device.

Patent Document 4 discloses a sensor comprising an excitation winding, a signal generator operable to generate an excitation signal and arranged to apply the generated excitation signal to the excitation winding, a sensor winding electromagnetically coupled to the excitation winding and a signal processor operable to process a periodic electric signal generated in the sensor winding when the excitation signal is applied to the excitation winding by the signal generator to determine a value of a sensed parameter. The excitation signal comprises a periodic carrier signal having a first frequency modulated by a periodic modulation signal having a second frequency, the first frequency being greater than the second frequency. In this way, the sensor is well suited to using digital processing techniques both to generate the excitation signal and to process the signal induced in the sensor windings. In an embodiment, the sensor is used to detect the relative position of two members. In other embodiments, the sensor is used to detect environmental factors such as temperature and humidity.

Patent Document 5 discloses an inductive sensor device and a method for inductive identification comprising a first exciter inductor and a second exciter inductor extending along a measurement range and vary spatially differently from each other. A first inductive coupling element and a second inductive coupling element couple a signal from the two exciter inductors into a receiver inductor. The inductive coupling elements are formed as resonance elements with a first resonance frequency f1 and a second resonance frequency f2. In order to be able to simply determine the position of both inductive coupling elements quickly and accurately, the two exciter inductors are driven by different transmission signals S1, S2. Each of the transmission signals S1, S2 includes signal components of a first carrier frequency near the first resonance frequency f1 varying in temporal progression, and of a second carrier frequency near the second resonance frequency f2 varying in temporal progression.

In an inductive linear position sensor, the receiver coils extend along a linear moving path of the conductive target and the conductive target has a certain linear extension. In an inductive arc position sensor, the receiver coils extend along an angular, particularly radial, moving path of the conductive target and the conductive target has a certain angular extension. In case the arc position sensor covers 360°, i.e., the moving target rotates completely around an axis, it is also referred to as inductive rotational position sensor.

It is an object of the present disclosure to provide an efficient and precise evaluation of the position of the moving target from the position signals provided by an inductive position sensor.

SUMMARY

According to the disclosure, the object is solved by a signal processing unit for an inductive position sensor, wherein the inductive position sensor provides a first position signal and a second phase-shifted position signal, particularly a sine position signal and a cosine position signal, comprising:

- a first input for the first position signal and a second input for the second phase-shifted position signal;
- an output for providing an AC excitation signal to the inductive position sensor;
- an oscillator connected to the output for generating the AC excitation signal; and
- a signal processor for calculating the position of a moving target of the position sensor from the first position signal and the second phase-shifted position signal;
- wherein the signal processing unit comprises at least one integrator for integrating an integer number of periods of the first position signal respectively an integer number of periods of the second phase-shifted position signal;
- wherein the signal processor calculates the position of the moving target of the position sensor from the integrated first position signal and the integrated second phase-shifted position signal.

Conventional circuit implementations are using a low-pass filter, particularly a resistor-capacitor (RC) low-pass filter, for measuring the amplitude of the first respectively second position signal, e.g., of a rectified AC signal. This disclosure is based on a new approach using a frequency-synchronized integration scheme for evaluating the effective amplitude value of the first position signal respectively second position signal, i.e., the sine signal respectively cosine signal. Frequency-synchronized means that an integer number $N_{INT}$ of sine periods or cosine periods are integrated continuously. An integrator behaves like an analogue 1st order low-pass filter if the integration time is comparable short. By integrating exactly $N_{INT}$ periods, the 'analogue integrator' becomes an 'analogue finite impulse response (FIR) filter' with 'zeros' at the fundamental and multiples of inductor-capacitor (LC)-oscillation frequency. In that sense, the number of integration phases defines the number of 'zeros' for this quasi-analogue low-pass FIR filter. A comparable 1st order RC low-pass filter is generating an attenuation and the remaining 'sine-ripple' is limiting the signal-to-noise ratio. The integrator approach according to the present disclosure can also be understood as a precise integrated 'mean-value evaluation' of $N_{INT}$ rectified sine respectively cosine phases without any ripples or other frequency related effects.

The RC low-pass filter of the art and the general integrator active circuitry of the present disclosure are comparable with respect to circuit implementation effort and size. A disadvantage, in sense of circuit size, for the RC low-pass filter is the functionality of an anti-aliasing filter in front of the analog-to-digital converter (ADC). Depending on the sampling frequency of the ADC, a high order low-pass filtering may become necessary. That would require several low-pass filter stages in series. While the RC time constant '$R_b*C_b$' of a low-pass filter defines the attenuation (−3 dB corner frequency) the time constant of the integrator, like '$1/(R_{int}*C_{int})$' of a RC-integrator, is behaving like a gain factor. High gain values can simply be reached with small $R_{int}$ and $C_{int}$ values. Further, the entire analogue integration process works like an amplification 'over time' and the number of integration periods acts like an additional gain factor.

According to a variant of the disclosure, the first position signal and the second position signal are analog signals. The first position signal can be a sine position signal and the second phase-shifted position signal can be a cosine position signal.

Pursuant to a variant of the disclosure, the signal processing unit comprises an analog-to-digital converter for converting the first position signal and the second phase-shifted position signal to a corresponding first digital position signal and to a corresponding second phase-shifted digital position signal. The analog-to-digital converter is arranged after the at least one integrator, such that the analog-to-digital converter converts the integrated first position signal respectively the integrated second phase-shifted position signal. Thus, the calculation of the position of the moving target of the position sensor from the integrated first position signal and the integrated second phase-shifted position signal can be performed by a digital signal processor (DSP). Furthermore, the DSP can forward a digital position signal to systems using the inductive position sensor according to the disclosure.

In a variant of the disclosure, the inductive position sensor comprises at least one transmitter coil receiving the AC excitation signal, a first receiver coil providing the first position signal and a second receiver coil providing the second phase-shifted position signal. Such an inductive position sensor can be understood as a transformer with two output coils. The transmitter coil (L) is for example interconnected with a capacitor (C) to perform an oscillator (LC-oscillator) in resonance.

The alternating magnetic field induces a voltage in the receiver coils. This induction method can be influenced by introducing a conductive target over the transformer. The conductive target is affecting like a shortcut for the magnetic field and is manipulating the induced voltages. This kind of amplitude modulation depends on the mechanical position of the conductive target. For this type of inductive sensor coils the implementation of the receiver coils as sine and cosine shaped layout is characteristically. This sophisticated coil layout together with the conductive target yields in a position depending on sine and cosine amplitude modulated signal at the receiver coils.

According to a variant of the disclosure, the signal processing unit of the inductive position sensor further comprises an oscillator controller for keeping the amplitude of the AC excitation signal in a predefined range. The oscillator controller is an active circuitry to keep the amplitude of the oscillator in a predefined range. This avoids distortions resulting from too high or too low amplitude levels. For example, a Peak-Detector is continuously monitoring the oscillation amplitude $V_{LCO}$, which is afterwards evaluated by an amplitude and frequency monitor This amplitude and frequency monitor computes the control values for a programmable current sources, i.e., an $I_{LCOp}$ and $I_{LCOn}$ to reach a predefined amplitude and to keep the amplitude at a constant level.

Pursuant to a variant of the disclosure, the at least one integrator is a resistor-capacitor (RC)-integrator. Thus, the integration process is characterized by its own time constant '$1/(R_{int}*C_{int})$' (resistor and capacitor integrator values), the number of integration phases $N_{INT}$ and the frequency of the LC-oscillator '$T_{LCO}=1/F_{LCO}$' themselves. Finally, an integration related factor (defining the integrated value of a rectified sine/cosine period) of '2/II' has to be taken into account.

In a variant of the disclosure, the signal processor, particularly the digital signal processor, implements a CORDIC/arctan algorithm for calculating the position of the moving target of the position sensor.

According to a variant of the disclosure, the oscillator is an inductor-capacitor (LC)-oscillator, preferably a current-driven or current-limited cross-coupled inverter circuitry. The LC tank is storing the oscillation energy that is proportional to the "oscillation current $I_{LCO}$". The characteristic impedance $Z_{LCO}$ is defining the voltage amplitude $V_{LCO}$ of this resonant circuit in ideal case based on the current $I_{LCO}$:

$$Z_{LCO} = \sqrt{\frac{C_X}{L_X}}$$

$$V_{LCO} = I_{LCO}\sqrt{\frac{L_X}{C_X}}$$

In real applications, the resonant circuit is damped by parasitic resistive elements. The active oscillation circuit of cross-coupled current-controlled inverters becomes necessary to compensate these losses and for keeping the amplitude constant.

Pursuant to a variant of the disclosure, the signal processing unit, particularly the signal processor, detects an offset in the integrated first position signal and/or an offset in the integrated second phase-shifted position signal and/or a gain mismatch between the integrated first position signal and the integrated second phase-shifted position signal and provides a corresponding negative compensation signal to the integrator for compensating the detected offset and/or a gain calibration signal for compensating the gain mismatch. This ensures that the offset voltage and/or gain mismatch does not degrade the output range of the integrator and the input range of the optional analog-to-digital converter respectively. The offset and/or gain mismatch in the integrated first position signal and/or second phase-shifted position signal is for example detected by an offset and gain error detection unit. The offset and gain mismatch detection and compensation bases on an analog signal processing of the signal processing unit, like comparators for comparing the peak values, i.e. maximum and minimum amplitude, of the first position signal respectively of the second position signal. Alternatively, the negative compensation signal or gain calibration signal is converted from a digital signal to an analog signal by a digital-to-analog converter, particularly to a negative analog signal. The digital negative compensation signal or gain calibration signal is for example generated by an optional digital signal processor.

In a variant of the disclosure, the signal processing unit provides low-pass filtering and calibration. The low-pass filtering provides a further noise reduction and the calibration is used to compensate the gain mismatch between the integrated first position signal and the integrated second phase-shifted position signal.

According to a particularly preferred variant of the disclosure, the first input and the second input are connected to a first multiplexer. Thus, the multiplexer is used to multiplex between the first position signal of the first input and the second phase-shifted position signal of the second input and selectively forwards the first position signal respectively the second phase-shifted position signal to the signal processor. Hence, the signal processor sequentially processes the first position signal and the second phase-shifted position signal. This reduces the required space for the circuitry to implement the signal processing unit according to the present disclosure because only one signal processor is necessary, which can process the first position signal and the second phase-shifted position signal. The required space for a multiplexer is significantly smaller than for a signal processor.

Pursuant to a variant of the disclosure, the first input and the second input are each connected to an amplifier and/or rectifier. Alternatively, the output of the first multiplexer is connected to an amplifier and/or rectifier. The amplifier and/or rectifier pre-processes the first position signal and/or the second phase-shifted position signal. In the first alternative, the first position signal and the second phase-shifted position signal are pre-processed by separate amplifier and/or rectifiers connected to the first input respectively the second input. This has the advantage, that the pre-processing can be specifically adjusted for the first position signal respectively the second phase-shifted position signal. In the second alternative, the first position signal and the second phase-shifted position signal are sequentially pre-processed by the same amplifier and/or rectifiers, which reduces the require circuitry size.

In a variant of the disclosure, the signal processing unit comprises a test signal generation unit for providing a test signal to the first multiplexer, wherein the test signal can have a variety of scaling factors. Using the test signal generation unit and the multiplexer the generated test signal can be applied to the signal processor. The signal processor processes the test signal like any other position signal and the result of this processing can be compared to an expected result, which is known for the applied test signal. In this way, the functioning of the signal processor can be checked. Using test signals with different scaling allows to test the signal processor for different position signals, particularly position signals with different amplitudes and/or frequencies.

According to a variant of the disclosure, the first multiplexer provides a non-inverted signal and inverted signal for each input.

Pursuant to a preferred variant of the disclosure, the signal processor applies a pseudo-synchronized interleafed sampling method to the multiplexed and integrated first position signal and second phase-shifted position signal. According to the pseudo-synchronized interleafed sampling method, the signal processor uses single multiplexed first position signals and second phase-shifted position signals to calculate the position of the moving target of the position sensor from the integrated first position signal and the integrated second phase-shifted position signal. The first position signal (sine signal) and the second phase-shifted position signal (cosine signal) are integrated over the integer number of periods in an alternating way. In a particularly preferred variant, the polarity of the first position signal and of the second phase-shifted position signal is swapped during consecutive measurements. The swapping is for example achieved by using the non-inverted or inverted output of the multiplexer for the corresponding input signal. This swapping or chopping technique for the first position signal and the second phase-shifted position signal removes any circuit offset and reduces the noise, mainly the low frequency and 1/f noise.

The pseudo-synchronized interleafed sampling method for examples bases on the following exemplary measurements of the first position signal and second phase-shifted position signal:

1. first position signal with positive polarity ($t_{n-3}$);
2. second position phase-shifted signal with positive polarity ($t_{n-2}$);
3. second position phase-shifted signal with negative polarity ($t_{n-1}$);
4. first position signal with negative polarity ($t_n$);
5. first position signal with positive polarity ($t_{n+1}$);
6. second position phase-shifted signal with positive polarity ($t_{n-2}$);
7. and so on.

From these Measurements the Following Mean Values are Calculated:

a. mean value of first position signal for time $t_m$=first position signal at $t_{n-3}$—first position signal at $t_n$;
b. mean value for second phase-shifted position signal for time $t_m$=second phase-shifted position signal at $t_{n-2}$—second phase-shifted position signal at $t_{n-1}$;
c. mean value of first position signal for time $t_{m+1}$=first position signal at $t_{n+1}$—first position signal at $t_n$;
d. mean value for second phase-shifted position signal for time $t_{m+1}$=second phase-shifted position signal at $t_{n+2}$—second phase-shifted position signal at $t_{n-1}$;
e. and so on.

Thus, for times $t_m$, $t_{m+1}$, . . . a mean value of the first position signal and a mean value of the second phase-shifted position signal are calculated, which are afterwards used by the signal processor to calculate the position of the moving target of the position sensor. Thus, although the first position signal and the second phase-shifted position signal are processed sequentially due to the multiplexer, the position calculation bases on the mean value of the first position signal and mean value of the second phase-shifted position signal for the same time points, i.e. times $t_m$, $t_{m+1}$, and so on. This is referred to as pseudo-synchronized.

Preferably, the sampling frequency of the first multiplexer is higher than the signal frequency of the position sensor, particularly at least 16 times higher, more preferably at least 32 times higher.

In a variant of the disclosure, the signal processing unit further comprises a peak detector for detecting the amplitude of the AC excitation signal provided to the output and a second multiplexer prior to the signal processor, wherein the AC excitation signal provided to the output is additionally provided to the first multiplexer and the signal processor compares the amplitude of the processed AC excitation signal provided to the first multiplexer with the detected amplitude of the peak detector provided to the second multiplexer. In this variant, the excitation signal is fed into the first multiplexer and the peak detector. If the first multiplexer selects the excitation signal as the output signal, the signal processing unit can determine the amplitude of this signal. Furthermore, the amplitude of the excitation signal is detected by the independent peak detector. The second multiplexer is used to sequentially forward the calculated amplitude of the signal processing unit and detected amplitude of the peak detector to the signal processor. The signal processor can compare these two amplitudes to provide further diagnostic capabilities.

According to a variant of the disclosure, the peak detector comprises an operational amplifier with a diode and a RC low-pass filter at the output.

According to the prior art and the present disclosure, the moving target can be any kind of conductive material, particularly a metal such as aluminium, steel or a printed circuit board with a printed copper layer. Usually, an inductive position sensor comprises a metallic target.

BRIEF DESCRIPTIONS OF THE DRAWINGS

Figure 2:
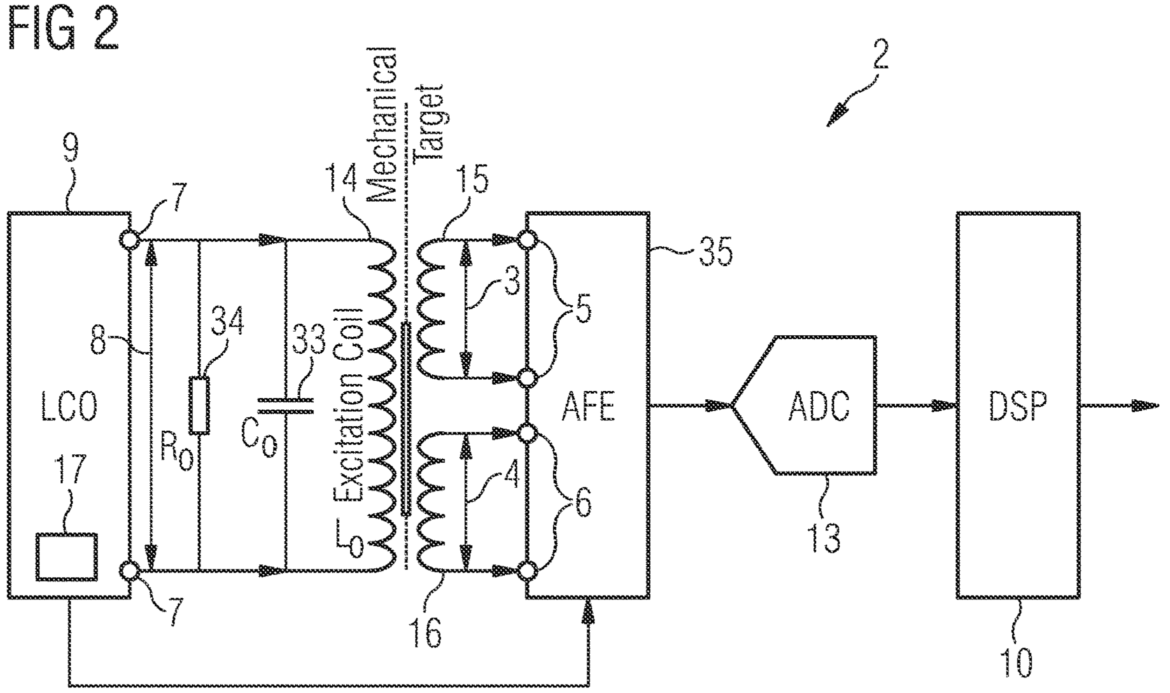
Figure 3:
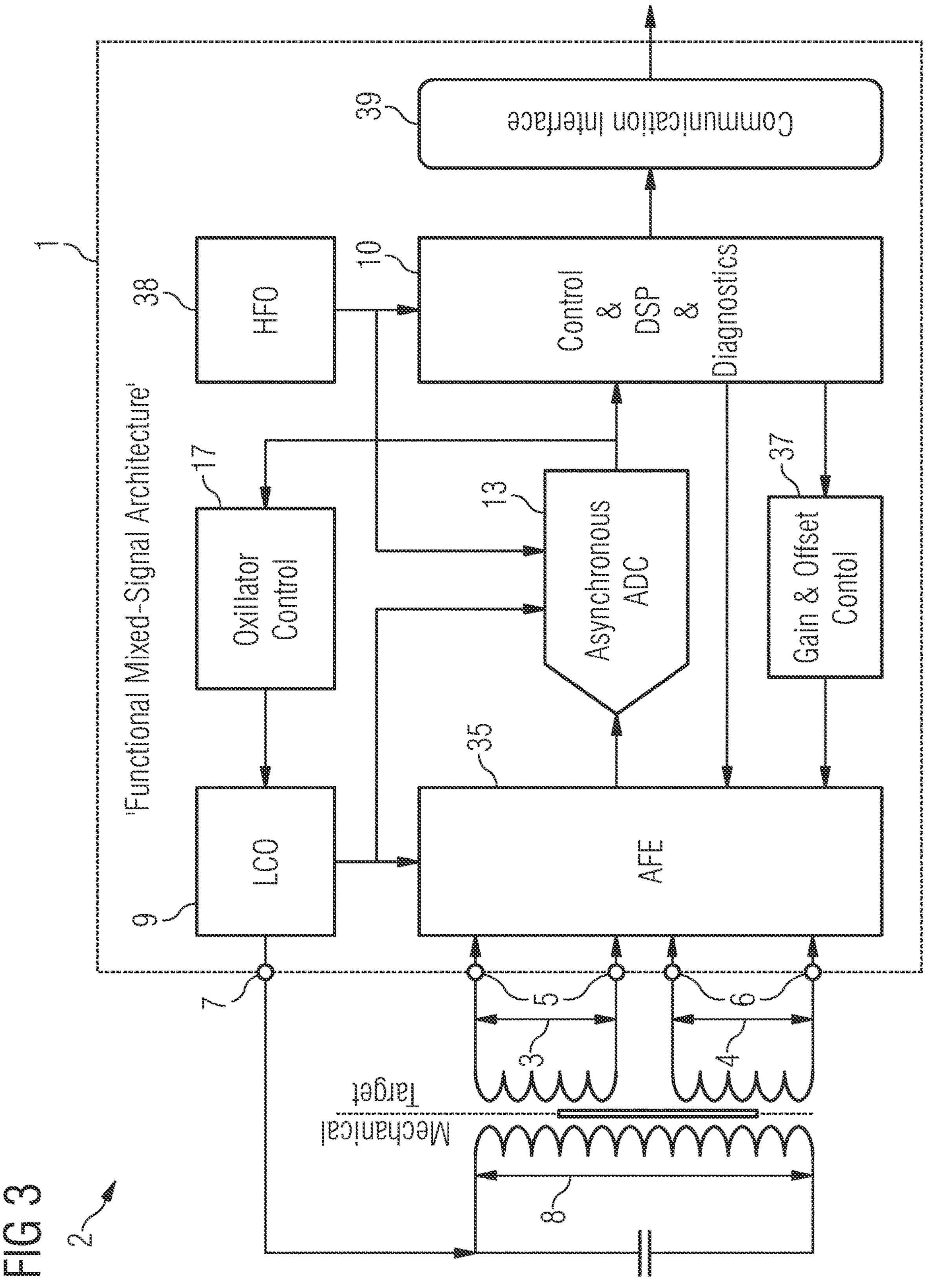
Figure 4:
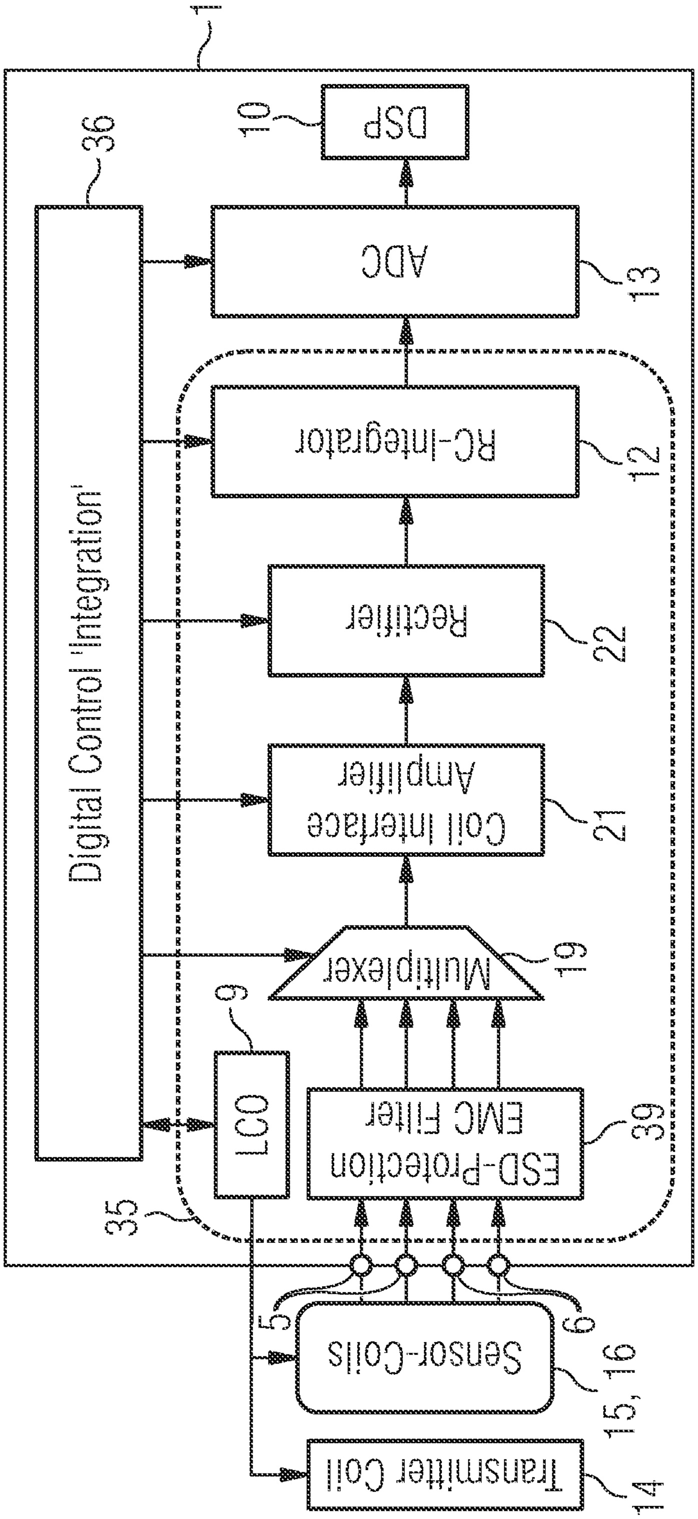
Figure 5:
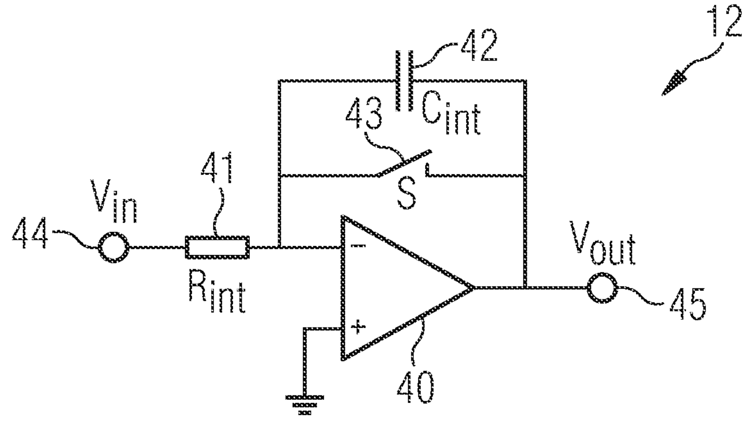
Figure 6:
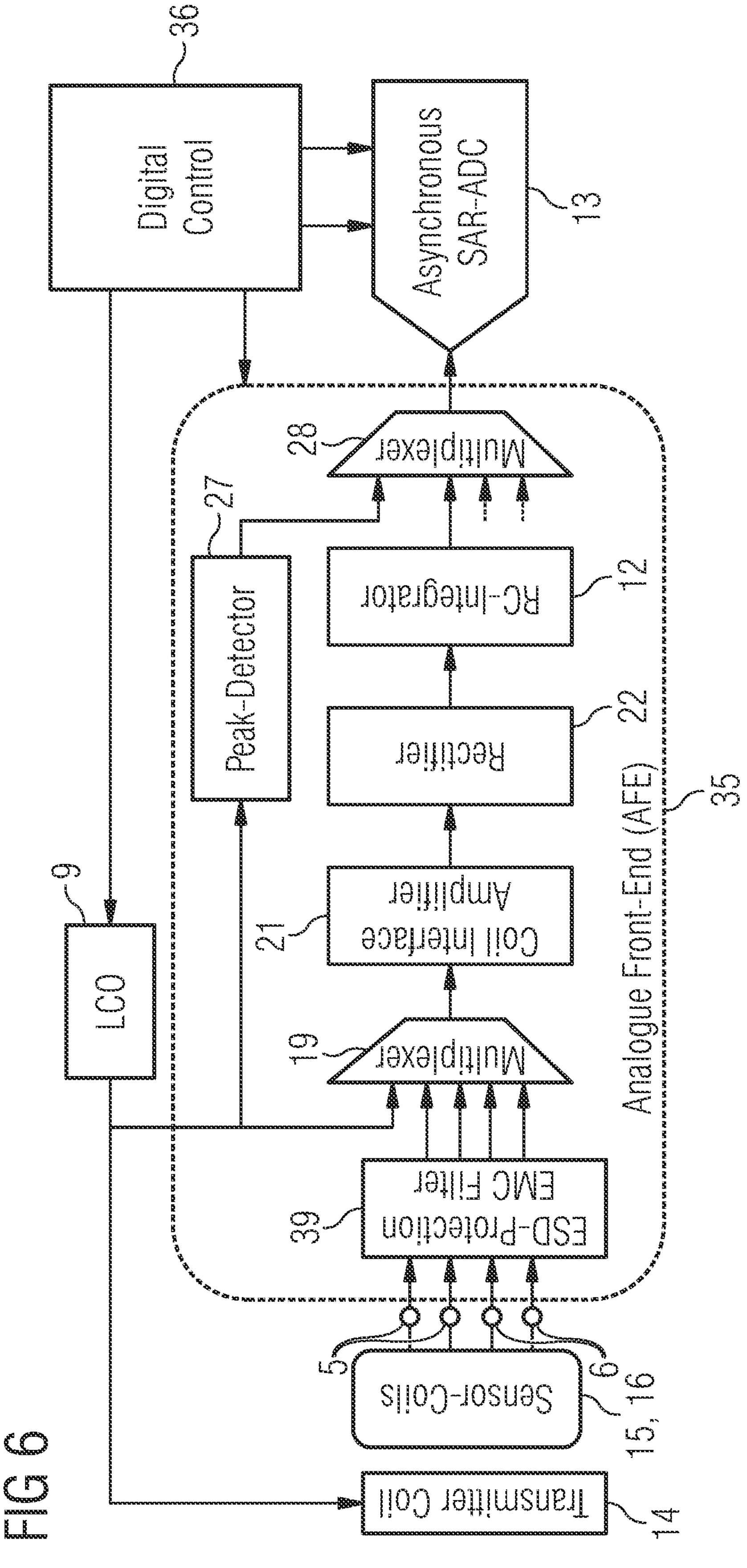
Figure 7:
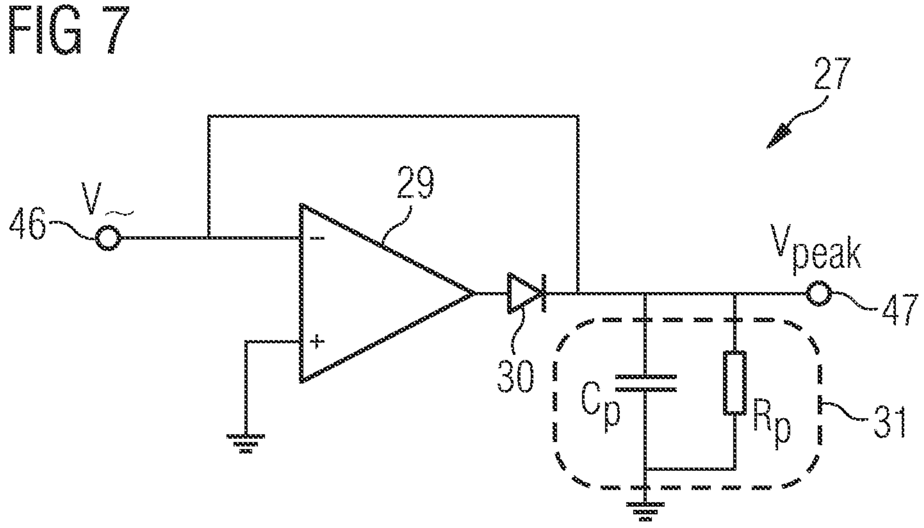
Figure 8:
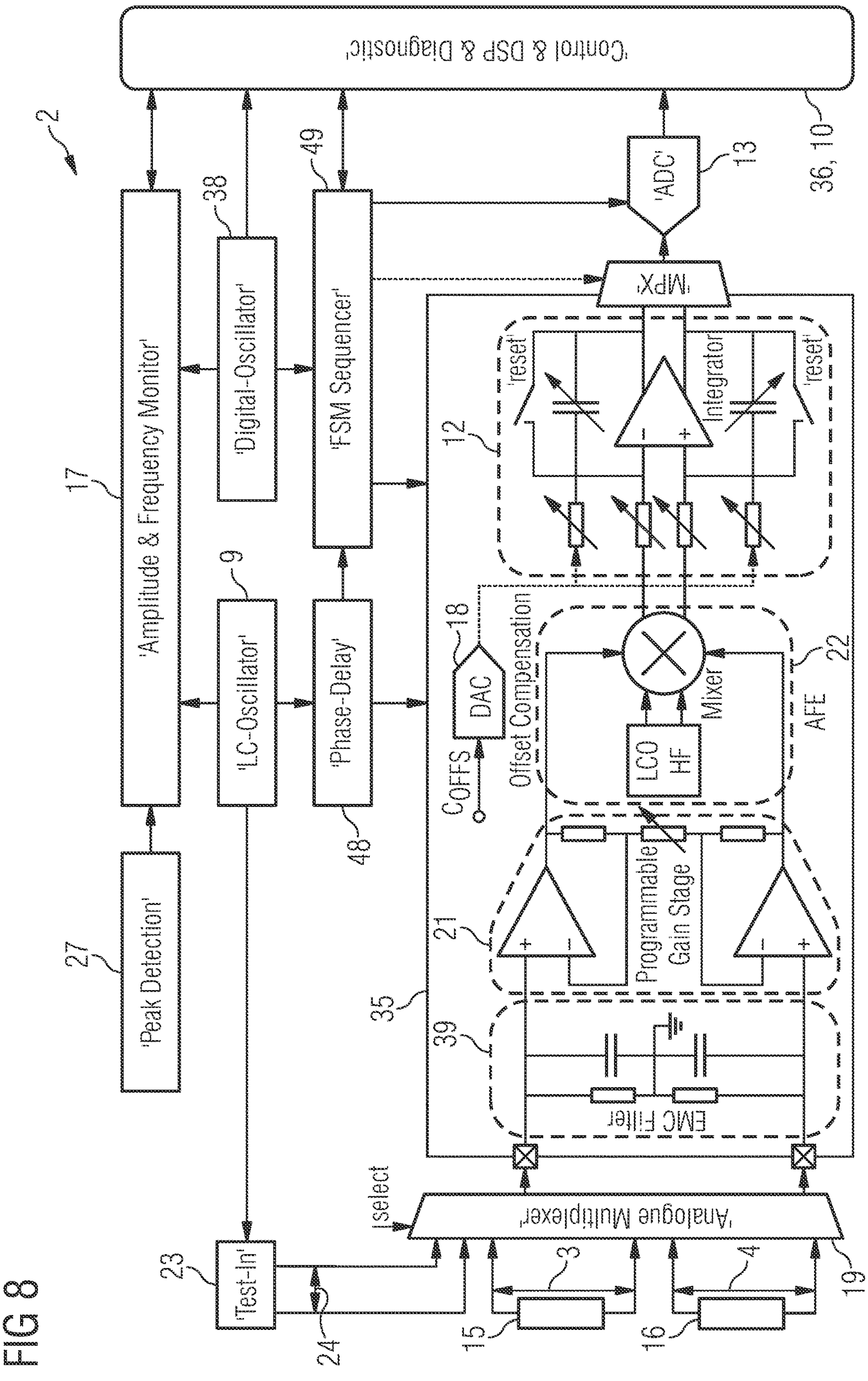
Figure 9:
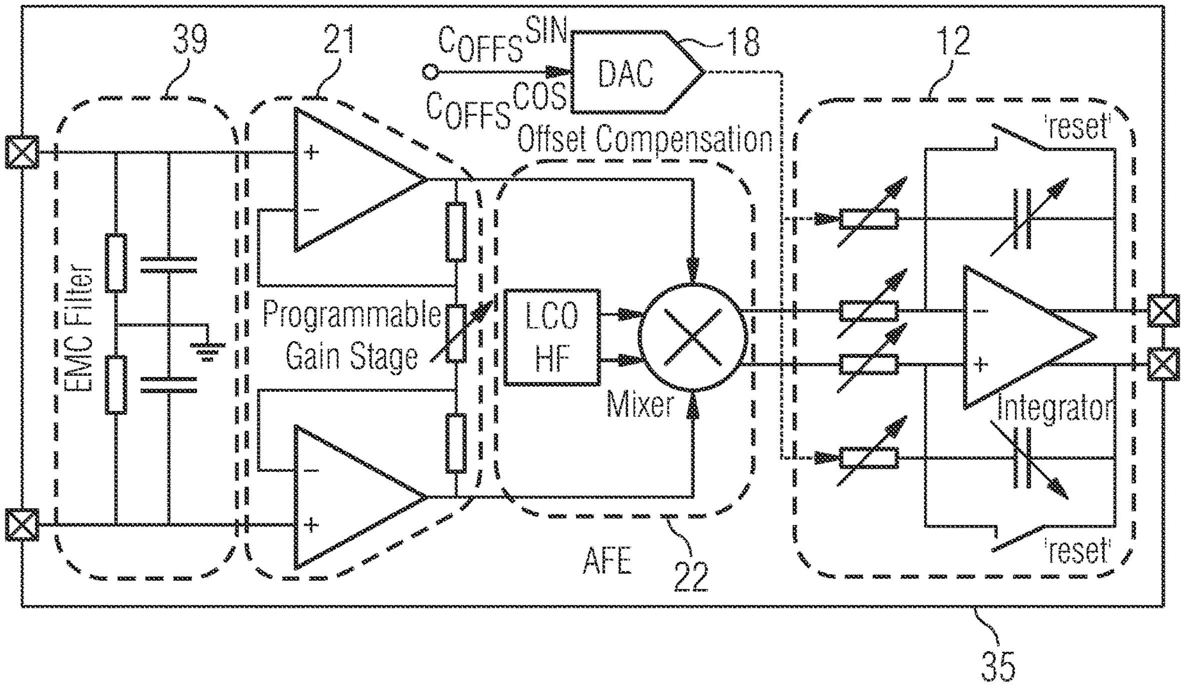
Figure 10:
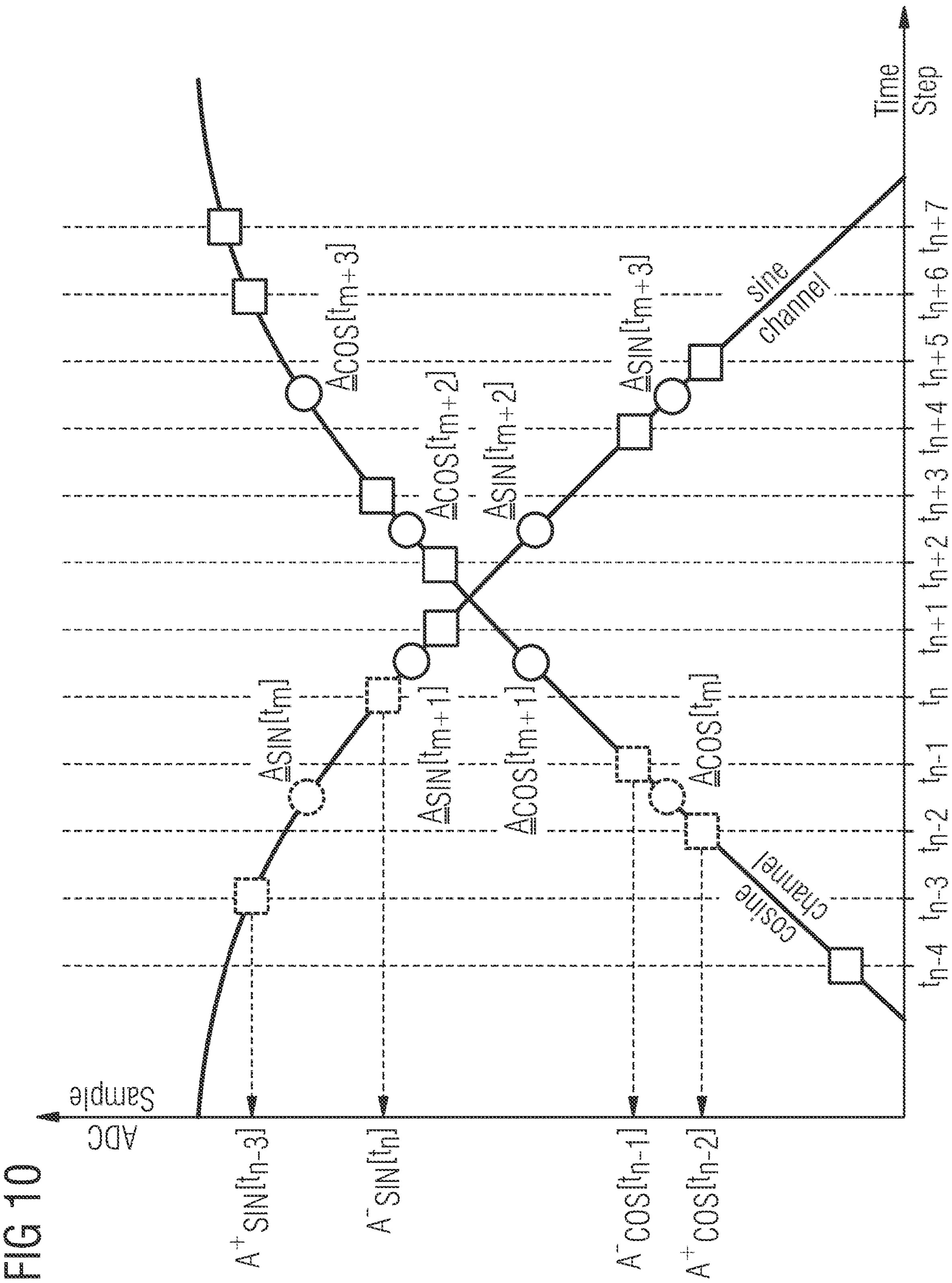
Figure 11:
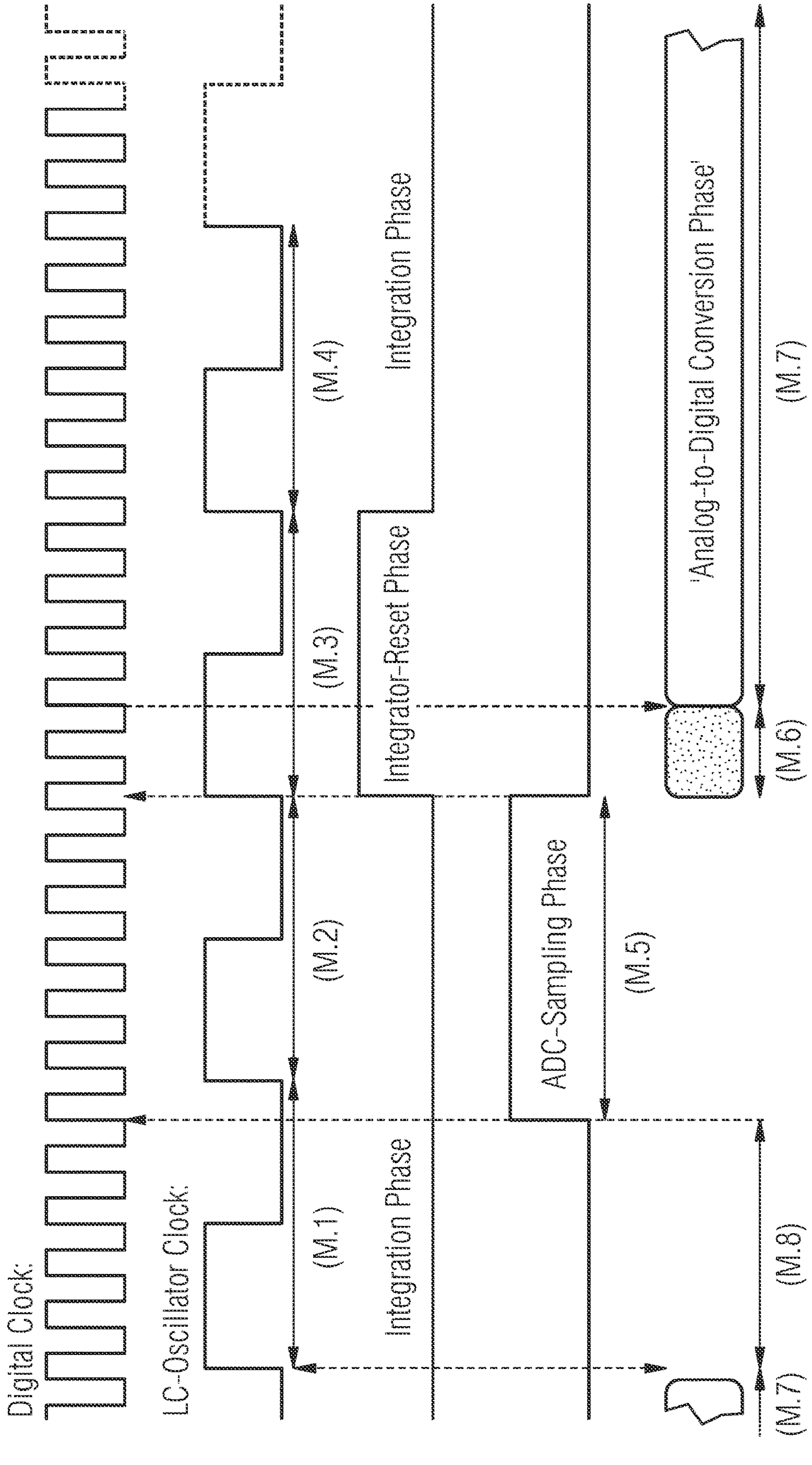
Figure 12:
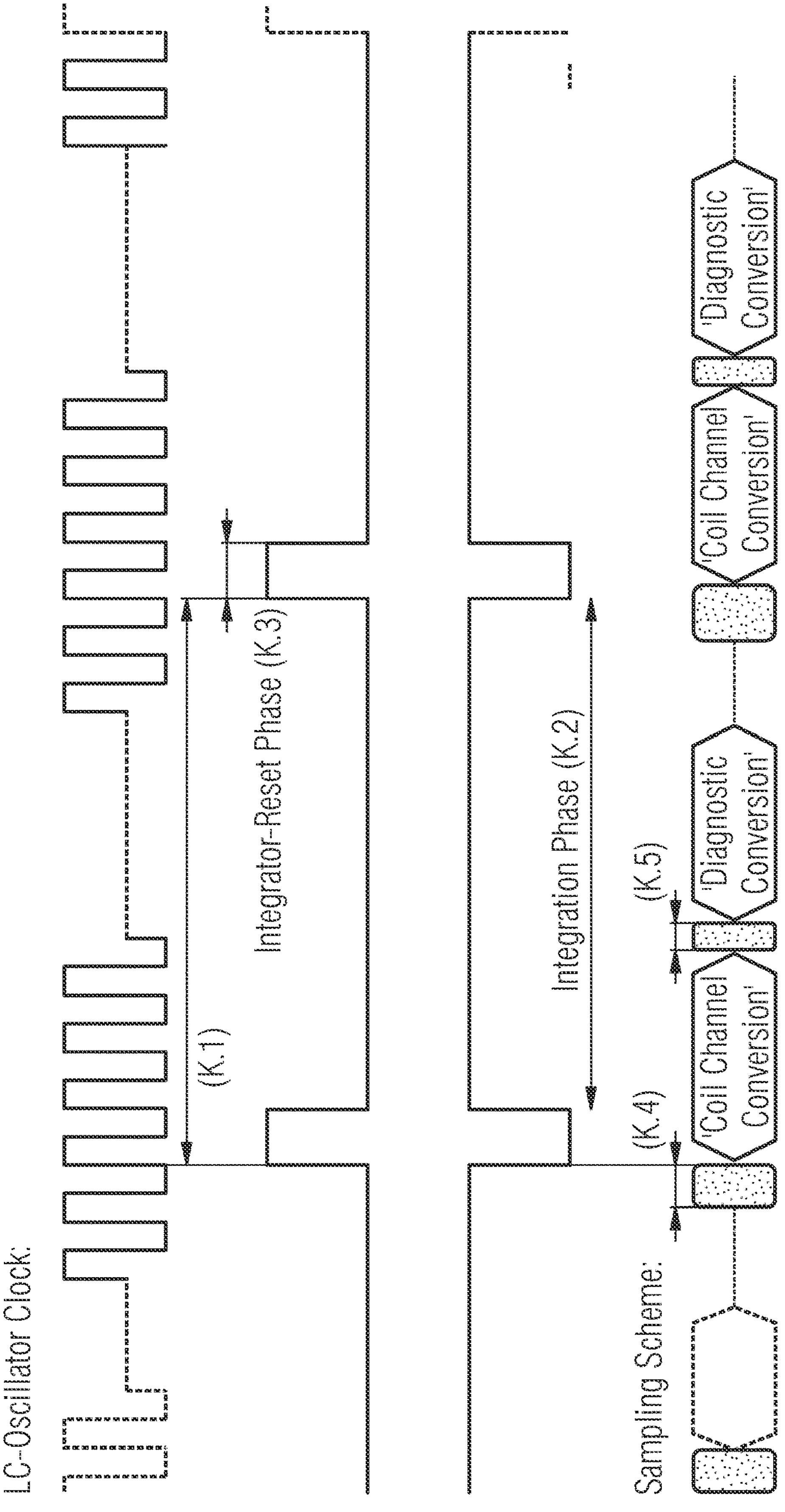
Figure 13:
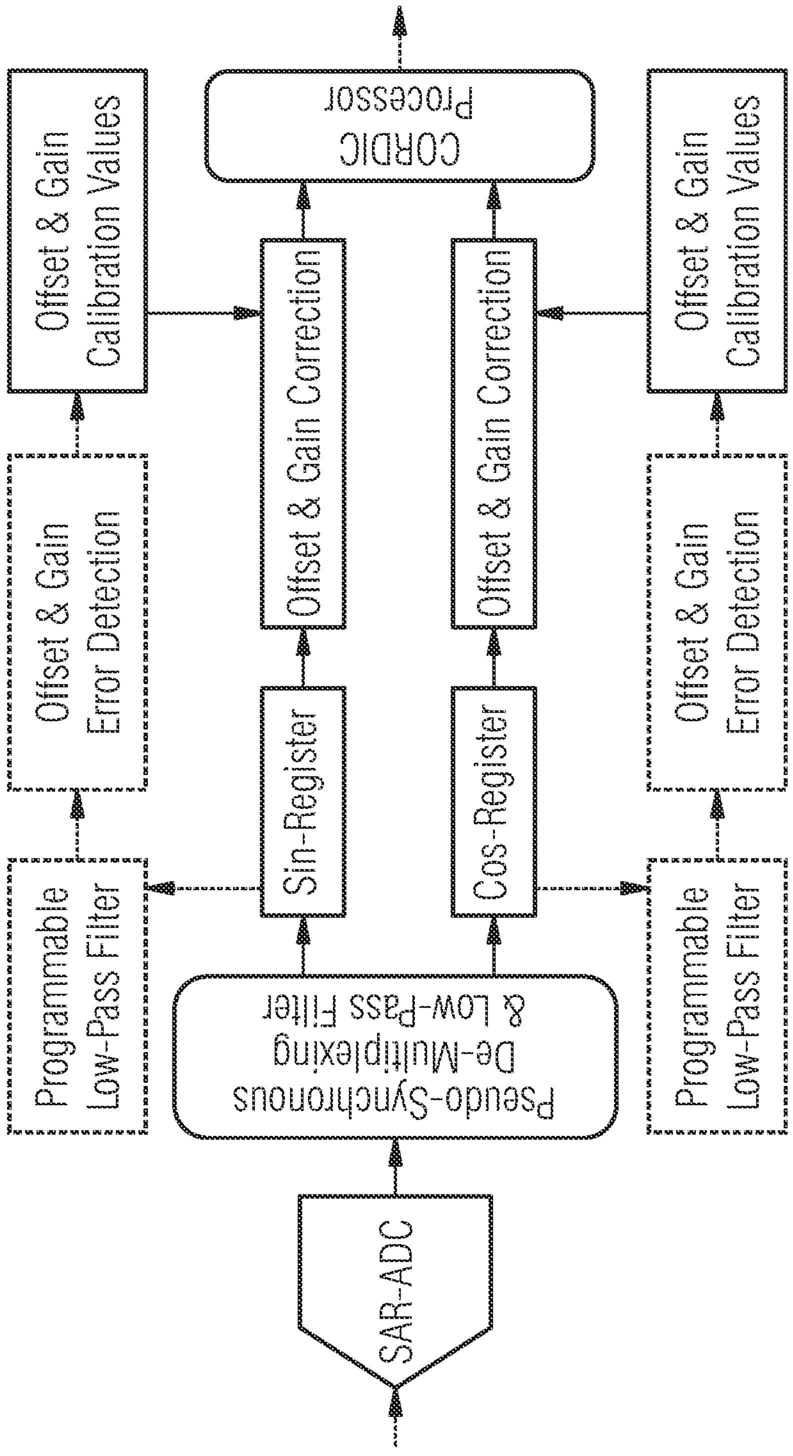
Figure 14:
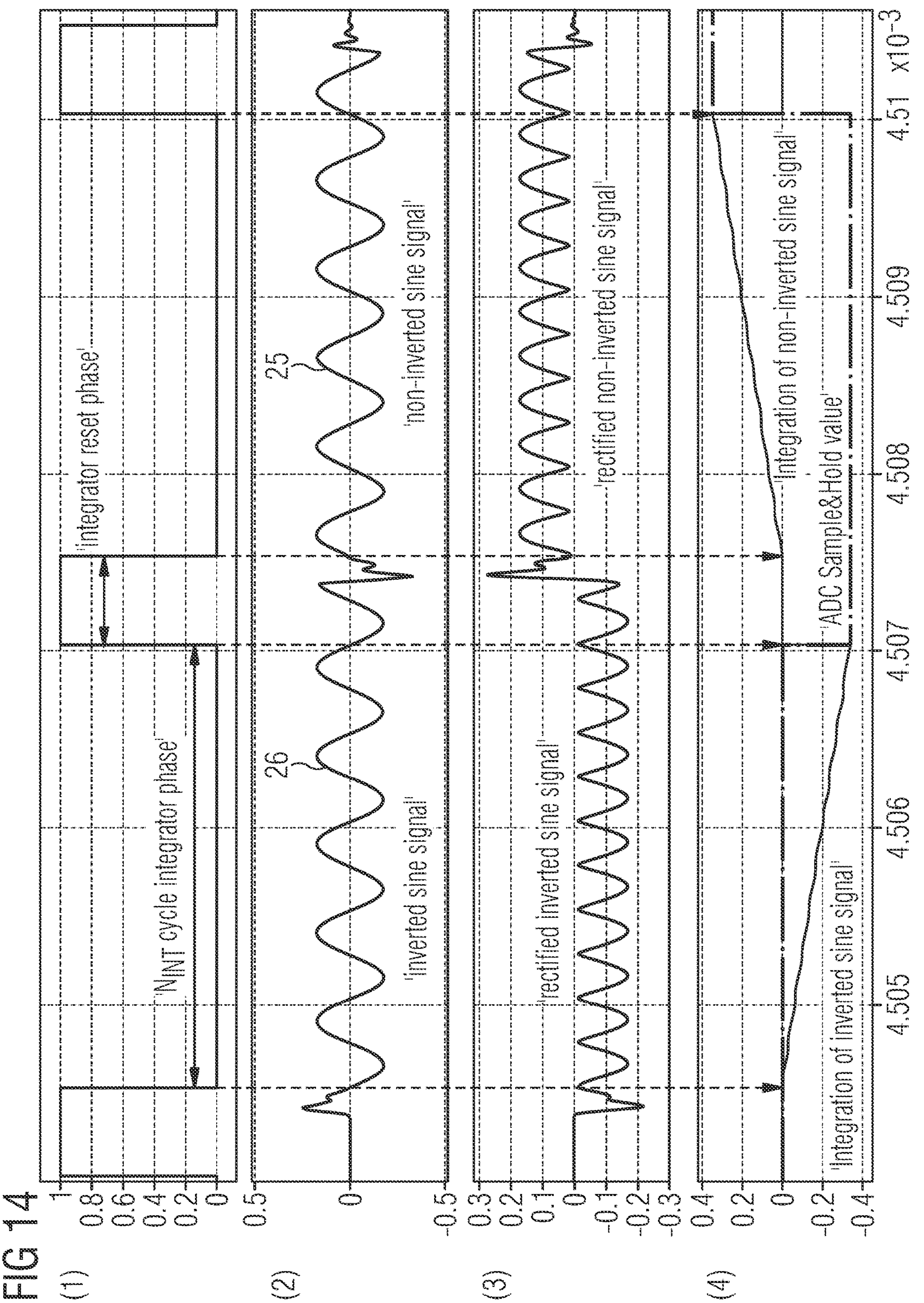

In the following, the disclosure will be further explained with respect to the embodiments shown in the figures. It shows:

FIG. 1 a simplified circuit diagram of an inductive position sensor (a) and a layout of a linear inductive position sensor (b), FIG. 2 a general signal processing block diagram for an inductive position sensor, FIG. 3 a block diagram of an inductive position sensor, FIG. 4 a detailed block diagram of a first embodiment of an inductive position sensor comprising a signal processing unit according to the present disclosure, FIG. 5 a circuit diagram of an RC-integrator, FIG. 6 a detailed block diagram of a second embodiment of an inductive position sensor comprising a signal processing unit according to the present disclosure, FIG. 7 a circuit diagram of a peak detector, FIG. 8 a detailed architecture of a complete inductive position sensor interface circuitry according to the present disclosure, FIG. 9 a detailed view of the analog front-end circuitry of the detailed architecture of FIG. 8, FIG. 10 a pseudo-synchronized interleafed sampling method implemented by a signal processing unit according to the present disclosure, FIG. 11 a diagram showing a detailed integration and conversion process, FIG. 12 a simplified signal flow for ADC scheduling, FIG. 13 an architecture of the digital post-processing method for the sine and cosine channel, and FIG. 14 the basic analog signal integration flow for this kind of amplitude measurement within this disclosure.

DETAILED DESCRIPTION

FIG. 1 shows a simplified circuit diagram of an inductive position sensor 2, referring to section (a) of the figure. The inductive position sensor 2 is an apparatus based on the principle of magnetic induction for detecting a moving target 11 like a metallic target. By using this principle of mechanically interacting with an electromagnetic field, a huge variety of sensors for several application in e.g., mechatronics, e-motors and object detections can be created. The essential advantage of this high reliable inductive sensing technique is the contact-free position detection of the moving target 11.

Principally this type of inductive position sensor 2 can be understood as a transformer with two output coils, namely a first receiver coil 15 and a second receiver coil 16. A simplified circuit diagram is given in section (a) of FIG. 1. The transmitter or excitation coil 14 is interconnected with a capacitor 33 to perform an oscillator 9 (LC-oscillator) in resonance. The alternating magnetic field induces a current (voltage) in the receiver coils 15, 16. This induction method can be influenced by introducing a conductive target (moving target) 11 over the transformer. The conductive target 11 is affecting like a shortcut for the magnetic field and is manipulating the induced currents. This kind of amplitude modulation depends on the mechanical position of the conductive target 11.

FIG. 1 also shows a layout of a linear inductive position sensor 2, referring to section (b) of the figure. For this type of inductive sensor coils, the implementation of the receiver coils 15, 16 as sine and cosine shaped layout is characteristically. This sophisticated coil layout together with the conductive target 11 yields a position depending on sine and cosine amplitude modulated signal at the receiver coils 15, 16.

The layout of the transmitter coil 14 and the receiver coils 15, 16 can be easily adapted to the geometrically dimensions and shape of a mechatronic sub-system. This results a high flexibility and versatility of this position sensing method. The coils 14, 15, 16 can be cost-efficient produced by using standardize multi-layer printed circuit boards (PCBs). The challenge of this position sensing approach is a robust and accurate sensor-signal evaluation technique. The proposed signal processing unit 1 of this disclosure provides an efficient and precise electronically accomplishment of inductive position sensor systems.

FIG. 2 shows a general signal processing block diagram for an inductive position sensor 2. The inductive sensor elements can be understood as a transformer with an excitation coil 14 like primary windings and two receiver coils 15, 16 as secondary windings. The conductive target 11 is influencing the AC-signal coupling to the receiver coils 15, 16 and yields a position depending on amplitude modulation in the receiver coils 15, 16. The AC excitation signal 8 within the primary windings of the transmitter coil 14 is generated with a resonant oscillator (LCO) 9 consisting of the coil inductivity of the transmitter coil 14 and a capacitor 33 in parallel. A resistor 34 in parallel is representing the electrical losses of several parasitic elements. The oscillation is controlled by an oscillator controller 17 mainly to keep the amplitude constant in a predefined range. The receiver coils 15, 16 are connected to a so-called analog front-end circuitry (AFE) 35 with main functionality of measuring their amplitude levels. The AFE can comprise an input multiplexer 19, an amplifier 21 and a rectifier 22. Afterwards the amplitude value is preferably converted to a digital number by an analog-to-digital converter (ADC) 13. Finally, a signal processor 10, particularly a digital signal processor (DSP), is following for calculating the position with digital low-pass filtering and calibration.

FIG. 3 shows a block diagram of an inductive position sensor 2. Essential for an inductive position sensor 2 is the resonant LCO 9 for sensor signal excitation. The LCO 9 comprises the excitation coil 14 and the capacitor 33. The LC-oscillator frequency is not stable and can vary over temperature and other electrical or mechanical impacts. An oscillator controller 17 is necessary to drive the LC-oscillation in a certain range to avoid distortions in case of too high or too low amplitude levels. The oscillator controller 17 can be integrated (FIG. 2) in the LCO 9 or connected thereto (FIG. 3).

The coupling factor (induction of the planar receiver coils) between the excitation coil 14 and the receiver coils 15, 16 can also vary in a wide range. This amplitude reduction effect is compensated by a gain & offset controller 37, to keep the received amplitude signals of the first position signal 3 and the second position signal 4 appropriately for the input range of the ADC 13. An iterative algorithm works like an automatic gain and range control. The digital part is running with a stable high frequency oscillator (HFO) 38 and performs three complex processes in parallel. At first, a signal processor 10 performs a signal-processing algorithm for low-pass filtering (noise reduction) and position calculation. Second, a finite-state machine is controlling the important process and sensor parameters. Finally, the measured and processed sensor data are provided to a communication interface 39.

The coil-sensor is characterized by the resonant frequency $F_{LCO}$ and quality $Q_{LCO}$:

$$F_{LCO} = \frac{1}{2\pi\sqrt{L_O C_O}}$$

$$Q_{LCO} = R_O\sqrt{\frac{C_O}{L_O}}$$

FIG. 4 shows a detailed block diagram of a first embodiment of an inductive position sensor 2 comprising a signal processing unit 1 according to the present disclosure.

The signal processing unit 1 according to the present disclosure is for an inductive position sensor 2, wherein the inductive position sensor 2 provides a first position signal 3 and a second position signal 4, particularly a sine position signal and a cosine position signal. The signal processing unit 1 of the disclosure comprises:

- a first input 5 for the first position signal 3 and a second input 6 for the second position signal 4;
- an output 7 for providing an AC excitation signal 8 to the inductive position sensor 2;
- an oscillator 9 connected to the output 7 for generating the AC excitation signal 8; and
- a signal processor 10 for calculating the position of a moving target 11 of the inductive position sensor 2 from the first position signal 3 and the second position signal 4; and
- at least one integrator 12 for integrating an integer number of periods of the first position signal 3 respectively an integer number of periods of the second position signal 4.

The signal processor 10 calculates the position of the moving target 11 of the inductive position sensor 2 from the integrated first position signal 3 and the integrated second position signal 4.

The first input 5 and the second input 6 can be protected by an ESD-protection and EMC filter 39.

The first position signal 3 and the second position signal 4 are analog signals. The signal processing unit 1 comprises an analog-to-digital converter (ADC) 13 for converting the first position signal 3 and the second position signal 4 to a corresponding first digital position signal and to a corresponding second digital position signal. The ADC 13 is located after the integrator 12 and before the signal processor 10. Thus, the analog-to-digital converter converts the integrated first position signal 3 and the integrated second position signal 4 and the signal processor 10 is a digital signal processor (DSP). The signal processor 10 implements a CORDIC/arctan algorithm for calculating the position of the moving target 11 of the inductive position sensor 2.

The inductive position sensor 2 comprises at least one transmitter coil 14 receiving the AC excitation signal 8, a first receiver coil 15 providing the first position signal 3 and a second receiver coil 16 providing the second position signal 4, as for example shown in detail on the left-hand side of FIG. 3. In FIG. 4, these details have been replaced by boxes, but generally could be implemented as shown in FIG. 3.

The LCO 9 is an LC-oscillator, preferably a current-driven or current-limited cross-coupled inverter circuitry. The LCO 9 comprises the transmitter coil 14, a capacitor 33 and a resistor 34 representing the electrical losses of several parasitic elements.

This disclosure is based on a new approach using a frequency-synchronized integration scheme for evaluating the effective amplitude value of a first position signal 3 and a second position signal 4. Frequency-synchronized means that an integer number $N_{INT}$ of periods are integrated continuously. The integrator 12 behaves like an analogue $1^{st}$ order low-pass filter if the integration time is comparable short. By integrating exactly $N_{INT}$ periods, the 'analog integrator' 12 becomes an 'analog FIR filter' with 'zeros' at the fundamental and multiples of LC-oscillation frequency. In that sense, the number of integration periods defines the number of 'zeros' for this quasi-analog low-pass FIR filter. A comparable $1^{st}$ order RC low-pass filter is generating an attenuation and the remaining 'sine-ripple' is limiting the signal-to-noise ratio. The integrator 12 approach can also be understood as a precise integrated 'mean-value evaluation' of $N_{INT}$ rectified periods without any ripples or other frequency related effects.

The circuit implementation effort and size of the integrator 12 approach according to the present disclosure is comparable to the RC-low-pass filter approach known from the prior art. A disadvantage, in sense of circuit size, for the RC low-pass filter is the functionality of an anti-aliasing filter in front of the ADC 13. Depending on the sampling frequency of the ADC 13, a high order low-pass filtering may become necessary. That would require several low-pass filter stages in series. While the RC time constant '$R_b$*$C_b$' of a low-pass filter defines the attenuation (−3 dB corner frequency) the time constant '1/$R_{int}$*$C_{int}$' of the integrator 12 is behaving like a gain factor. High gain values can simply be reached with small $R_{int}$ and $C_{int}$ values. Further, the entire analogue integration process works like an amplification 'over time' and the number of integration periods $N_{INT}$ acts like an additional gain factor.

According to the embodiment of FIG. 4, the first input 5 and the second input 6 are connected to a first multiplexer 19. The signal processor 10 applies a pseudo-synchronized interleafed sampling method to the multiplexed and integrated first position signal 5 and second phase-shifted position signal 6.

FIG. 5 shows a detailed circuit diagram of an RC-integrator 12. An input 44 of the RC-integrator 12 is connected to a first terminal of a resistor 41. A second terminal of the resistor 41 is connected to an inverting input of an operational amplifier 40 of the RC-integrator 12. A non-inverting input of the operational amplifier 40 is connected to electrical ground.

A capacitor 42 is arranged between the inverting input of the operational amplifier 40 and an output of the operational amplifier 40. A switch 43 is arranged parallel to the capacitor 42. The switch 43 becomes necessary to set the initial integrator condition to zero volt, i.e., by discharging the capacitor 42.

FIG. 6 shows a detailed block diagram of a second embodiment of an inductive position sensor comprising a signal processing unit according to the present disclosure. The second embodiment of FIG. 6 differs from the first embodiment of FIG. 4 by additionally comprising a peak detector 27 for detecting the amplitude of the AC excitation signal 8 provided to the output 7 and a second multiplexer 28 prior to the signal processor 10. The AC excitation signal 8 provided to the output 7 is additionally provided to the first multiplexer 19 and the signal processor 10 compares the amplitude of the processed AC excitation signal 8 provided to the first multiplexer 19 with the detected amplitude of the peak detector 27 provided to the second multiplexer 28.

FIG. 7 shows a circuit diagram of the peak detector 27 of the second embodiment shown in FIG. 6. The input of the peak detector 27 is connected to an inverting input of an operational amplifier 29, while a non-inverting input of the operational amplifier is connected to electrical ground. An output of the operational amplifier is connected to the anode of a diode 30. The cathode of the diode 30 is connected to an output 47 of the peak detector. Furthermore, the cathode of the diode is connected to the inverting input of the operational amplifier 29 as a feedback loop. An RC low-pass filter 31 is connected between the output 47 of the peak detector 27 and electrical ground.

An important aspect for automotive sensor applications is the diagnostic capability, mainly for supporting functional safety requirements. An analogue signal path with enhanced diagnostic features is shown in FIG. 5. The basic approach is to feed the LC-oscillator signal directly into the AFE 35 for measuring the amplitude. In parallel, the peak detector 27 is implemented to provide continuously the amplitude signal for comparison and integrity. The peak detector 27 is shown in detail in FIG. 6 and represents a redundant hardware implementation and consists of the operational amplifier 29, the diode 30 and the RC low-pass filter 31. With these enhancements, two hardware-different amplitude measurement approaches for an AC excitation signal 8 are available. While the AFE 35 is determining an integrated (similar to effective) amplitude value, the peak detector 27 is providing the amplitude peak value of the positive and the negative phase directly. The comparison for equality of these measurement values is done in the signal processor 10.

FIG. 8 shows a detailed architecture of an inductive position sensor 2 interface circuitry according to the present disclosure. FIG. 9 shows a detailed view of the AFE 35 of the detailed architecture of FIG. 8.

The AFE 35 is implemented with differential circuitry. This improves mainly the immunity regarding distortions and power supply noise. A low-noise instrumentation amplifier 21 with a programmable gain resistor network is via the EMC filter 39 directly connected with the sensor coils 15, 16. The rectifier 22 is implemented using a mixer that is basically a CMOS transmission-gate switch. It realizes the multiplication of the phase-delayed LCO-clock signal with the output of the amplifier 21. The final stage of the analogue signal-processing path is the integrator 12. It is composed of a programmable resistor '$R_{INT}$' and capacitor '$C_{INT}$' array to reach a wide range of integration time constants. Further, a switching network is implemented to realize the 'reset' function of the integrator 12 that forces the differential output value to zero. The AFE 35 contains an analogue offset compensation at the integrator stage.

The sensor coils 15, 16 are suffering from a crossfeed or crosstalk directly from the excitation coil 14 to the lead wires or other non-linearity of the coil layout. This is considered by assuming a LC-oscillator layout-depending amplitude $V_{OFFS}^{sin}$ and $V_{OFFS}^{cos}$ respectively. Additionally, a gain mismatch with different coil coupling (attenuation) factors $C_{ATT}^{sin}$ and $C_{ATT}^{cos}$ is considered. After rectification of the receiver coil signals $S_{sin}(t)$ and $S_{cos}(t)$ this coupling effect appears like a static offset voltage $\hat{U}_{sin}$ and $\hat{U}_{cos}$ and will be integrated in addition to the raw sensor signals 3, 4.

Especially for small coil layouts, these offset amplitudes can reach the size of the raw sensor signals 3, 4. The compensation of these offsets is done by adding a complementary negative voltage as an additional input path to the integrator 12. A digital-to-analogue converter (DAC) 18 controlled by the digital part (calibration values) generates these voltages $V_{DAC}^{sin}$ and $V_{DAC}^{cos}$. This ensures that the offset voltage does not degrade the output range of the integrator 12 and the input range of the ADC 13 respectively.

$$S_{sin}(t)=A_{LCO}*C_{ATT}^{sin}*\sin(\omega_{PS}*t)*\sin(\omega_{LCO}*t)+V_{OFFS}^{sin}*\sin(\omega_{LCO}*t)$$

$$S_{cos}(t)=A_{LCO}*C_{ATT}^{cos}*\cos(\omega_{PS}*t)*\sin(\omega_{LCO}*t)+V_{OFFS}^{cos}*\sin(\omega_{LCO}*t)$$

$$\hat{U}_{sin}=\int V_{OFFS}^{sin}*\sin(\omega_{LCO}*t)\approx V_{DAC}^{sin}$$

$$\hat{U}_{cos}=\int V_{OFFS}^{scos}*\sin(\omega_{LCO}*t)\approx V_{DAC}^{cos}$$

The multiplexer 19 defines the differential input channel for the AFE 35 and is controlled by the finite-state-machine (FSM) Sequencer module. It is composed of low-resistive CMOS transmission-gate switches. The input of the multiplexer 19 is connected directly to the first receiver coil 15 (sine coil) and the second receiver coil 16 (cosine coil) of the inductive position sensor 2. The 'Test-In' channel connected to a test signal generation unit 23 has been implemented for diagnostic purposes. A scaled voltage of the LCO 9 is generated here for a self-test of the complete AFE 35 and ADC 13 path. A certain variety of scaling factors is necessary to validate the settings of the amplifier 21 and time constants of the integrator 12. Further, this multiplexer 19 is providing inverted and non-inverted signals for each input.

The LC-oscillator 9 is principally a current-driven or current-limited cross-coupled inverter circuitry. The LC tank is storing the oscillation energy that is proportional to the "oscillation current $I_{LCO}$. The characteristic impedance $Z_{LCO}$ is defining the voltage amplitude $V_{LCO}$ of this resonant circuit in ideal case based on the current $I_{LCO}$:

$$Z_{LCO}=\sqrt{\frac{C_X}{L_X}}$$

$$V_{LCO}=I_{LCO}\sqrt{\frac{L_X}{C_X}}$$

In real applications, the resonant circuit is damped by parasitic resistive elements. The active oscillation circuit of cross-coupled current-controlled inverters becomes necessary to compensate these losses and for keeping the amplitude constant. The peak detector 27 is continuously monitoring the oscillation amplitude $V_{LCO}$ and is evaluated by the oscillator controller 17, also referred to as Amplitude & Frequency Monitor. The oscillator controller 17 computes the control values for the programmable CMOS current sources $I_{LCOp}$ and $I_{LCOn}$ to reach a predefined amplitude and to keep the amplitude at a constant level.

The LC-oscillation sine wave signal is phase-delayed because of several parasitic effects in the sensor coils 15, 16, the EMC filter 39 and the input multiplexer 19. Mainly to avoid distortions during rectification a phase-delay module 48 provides a phase-synchronous clock signal for the rectifier 22.

At first, the frequency monitor 17 is evaluating the frequency proportion between the LC-oscillator 9 and the digital oscillator 38 (frequency counter principle). The resonant frequency is predefined by external components and is assumed to be in range from 2 to 6 MHz. If the resonant frequency is outside of this range the sensor interface operation will be stopped. Beside the frequency, the LC-oscillator amplitude is monitored. If the amplitude becomes too high, distortion effects can degrade the sensor performance. If the amplitude is too low, the signal quality for sensor position detection is affected by increased noise and reduced resolution. Further, this module includes a level control processor (PID control) keeping the amplitude in a predefined range.

The digital oscillator 38 is an on-chip relaxation oscillator and is temperature compensated and calibrated during ATE test. The generated clock signal can be handled as a 3% accurate time base.

The FSM sequencer 49 is a measurement control subsystem and works synchronously with the LC-oscillator 9. The basic operation is to manage the sequence of integration cycles, reset phase, settings of the multiplexer channels and sample conversion scheme.

The signal processor 10 and signal processing unit controller 36 are shown in FIG. 8 as a single module. This module comprises a digital signal processor for filtering the ADC sample values, the CORDIC algorithm for position or angle calculation, a set of parameters for controlling the measurement cycles and some functions for analysis and diagnostic of several measurement values.

FIG. 10 shows a pseudo-synchronized interleafed sampling method implemented by a signal processing unit according to the present disclosure. The important part of this disclosure is the time succession of measurements and the calculation of mean values. This measurement approach utilizes values from a single multiplexed analog path. Further, it compensates the sampling delay caused by channel multiplexing. The sine channel (first position signal 3) and cosine channel (second position signal 4) are measured in an alternating way using multiplexer 19 and in between, the polarity is 'swapped'. This swapping or chopping technique for the input channels (sensor coils 15, 16) is necessary to remove any circuit offset and reduces the noise, mainly the low frequency and 1/f noise.

FIG. 10 illustrates the interleaved sampling scheme. The circles are defining the time points $t_m$ of the new calculated mean values. This treatment generates a measurement value delay of 2.5 ADC conversion steps that is equal for sine and cosine channel.

The interleaved sampling scheme can be processed with four consecutive conversion steps:

1. sine channel with positive polarity at time step tn−3:

$$A^{+}_{SIN}[tn-3]$$

2. cosine channel with positive polarity at time step tn−2:

$A^{+}_{COS}[tn-2]$ 3. cosine channel with negative polarity at time step tn−1:

$A^{-}_{COS}[tn-1]$ 4. sine channel with negative polarity at time step tn:

$A^{-}_{SIN}[tn]$ 5. sine channel with positive polarity at time step tn+1:

$A^{+}_{SIN}[tn+1]$ 6. cosine channel with positive polarity at time step tn+2:

$A^{+}_{COS}[tn+2]$

7 . . . .

After capturing these four values $A^{+}_{SIN}$, $A^{+}_{COS}$, $A^{-}_{COS}$, $A^{-}_{SIN}$, the calculation of the mean value is performed with the equations hereafter. For following mean value calculations two new samples (e.g., steps 5. and 6. above) are sufficient:

$$\bar{A}_{SIN}[tm]=A^{+}_{SIN}[tn-3]-A^{-}_{SIN}[tn]$$

$$\bar{A}_{COS}[tm]=A^{+}_{COS}[tn-2]-A^{-}_{COS}[tn-1]$$

$$\bar{A}_{SIN}[tm+1]=A^{+}_{SIN}[tn+1]-A^{-}_{SIN}[tn]$$

$$\bar{A}_{COS}[tm+1]=A^{+}_{COS}[tn+2]-A^{-}_{COS}[tn-1]$$

With this method, the channel throughput rate is cut in half, compared with the ADC sampling rate. Pseudo-synchronized means that even though the channels and polarities are sampled after each other. The sampling time point for the sine $\bar{A}_{SIN}$ and the cosine $\bar{A}_{COS}$ values is (approximately) the same, if the sampling frequency is about 32 times (or more) higher than the signal frequency of the position sensor themselves.

The analogue integration phase has to run synchronously with the resonant LC-oscillator 9 to ensure exactly the integration of $N_{INT}$ (integer) phases. After this integration phase, a reset of the analogue integrator circuitry 12 is invoked for an entire oscillation phase. Further, this reset phase is used for an inherent offset cancellation of the operational amplifiers. The detailed integration and conversion process is depicted in FIG. 11. An important outcome of this disclosure is the implementation of a sophisticated synchronization procedure between the LC-oscillation based integration and the analogue-to-digital conversion process that is running with the digital clock. To reach this kind of synchronization a SAR-ADC is realized with an asynchronously working sample-and-hold stage for capturing the input voltage. It is presumed that the digital clock frequency is minimum factor 10 higher than the LCO frequency.

Detailed description based on the signal flow of FIG. 12: The ADC-sampling phase is activated in the next-to-last LCO period (M.1) of the integration phase. This ensures that the sampling duration is slightly larger than the last integration cycle (M.2). The ADC sampling phase is closed precisely with the positive edge of the LCO-clock (M.3) that is disposed as the integrator reset phase. After the ADC-sampling phase is closed, the analog captured value is stored for a short time 'synchronization' window (M.6). The following analog-to-digital conversion phase (SAR principle) is then started synchronously with the digital clock (M.7).

An important enhancement of the proposed signal processing architecture is the possibility to sample multiple analog channels for diagnostic purposes. SAR-ADCs realized in modern mixed-signal technologies offer a conversion rate of a few MS/s at 14-bit accuracy and they fit into the requirements of this disclosure optimally. FIG. 12 shows the simplified signal flow for this ADC scheduling. Based on a programmable number $N_{INT}$ (K.2) of LC-oscillator periods the integration process duration is given by (K.1). The programmable 'integrator reset' phase (K.3) is exactly one LCO period in this example. This result in a measurement repetition time $T_{INTP}$ (E.15). If the ADC conversion time $T_{ADC}$ is significant shorter than the integration process duration $T_{INTP}$ intermediate conversions can be applied. If the condition of $\bar{A}_{COS}[tm]=A^{+}_{COS}[tn-2]-A^{-}_{COS}[tn-1]$ is valid, two ADC conversions can be performed during the integration process. The shaded areas are highlighting the sample phase for the SAR-ADC. The coil channel conversion starts synchronously with the integrator reset phase. Thereafter the diagnostic conversion is executed.

$$T_{INTP}=(N_{INT}+1)/F_{LCO}$$

$$T_{INTP}>2.5*T_{ADC}$$

This disclosure comprises a sophisticated analogue and digital signal processing path for an inductive sensor interface circuitry. The architecture of the digital post-processing method for the sine and cosine channel is depicted in FIG. 13. The block 'Control & DSP & Diagnostic' of FIG. 8 includes this digital processing implantation.

The first processing stage executes the combined channel de-multiplexing and pseudo-synchronization as given in FIG. 10 and provides the raw sample values $S_{SIN}$[tm], $S_{COS}$[tm]. A programmable 1st order IIR low-pass filter is available for further noise reduction that improve the position calculation precision. The 1st order IIR low-pass filter is defined by:

$$R_{SIN}[tm]=C_a*S_{SIN}[tm]+C_b*R_{SIN}[tm-1], 0<C_a<1, C_b=1-C_a$$

$$R_{COS}[tm]=C_a*S_{COS}[tm]+C_b*R_{COS}[tm-1], 0<C_a<1, C_b=1-C_a$$

The most significant sensor accuracy reduction is caused by offsets and amplitude mismatch. The 'Offset & Gain Error Detection' block is monitoring the minimum and maximum values of each sine and cosine channel during operation. Based on these 'peak' values the sensor offsets $O_{SIN}$, $O_{COS}$ and the gain mismatch $G_{ERR}$ can be calculated. Further, the offset and gain correction values can be determined in an external calibration run and stored in dedicated calibration registers. In the following processing stage, the sensor values are corrected by:

$$P_{SIN}[tm]=R_{SIN}[tm]+O_{SIN}$$

$$P_{COS}[tm]=G_{ERR}*(R_{COS}[tm]+O_{COS})$$

Finally, the position or angle is computed with a classical CORDIC algorithm:

'Position @$t_m$'=CORDIC{$P_{SIN}$[tm],$P_{COS}$[tm]}

Following the method for gain and offset correction of this disclosure is described in detail and can be done automatically for rotary sensors. The calculated sensor offsets $O_{SIN}$ and $O_{COS}$ values are divided in an analogue compensation value, DAC voltage equivalents $C_{OFFS}^{sin}$ ($V_{DAC}^{sin}$) and $C_{OFFS}^{cos}$ ($V_{DAC}^{cos}$) as given in FIGS. 8 and 9, and a digital value as described above to be applied for highly precise position calculations. Because of the limited resolution of $V_{DAC}$, the offset cannot be removed completely. If the analogue offset compensation is provided by these values, the new measured and calculated sensor offsets $O_{SIN}$ and $O_{COS}$ values are already reduced by this amount. The overall offset and gain compensation procedure is subdivided in three successive steps:

1st iteration: analogue offset compensation by using the DAC;

2nd iteration: analogue gain adaptation by using the PGA and integrator time-constant;

3rd iteration: digital calculation of remaining offset $O_{SIN}$, $O_{COS}$ and gain mismatch $G_{ERR}$.

If the digital offset or digital peak-amplitude values are deviating from pre-defined limits the above defined 3-step iteration process needs to be invoked again.

FIG. 14 illustrates the basic analog signal integration flow for an amplitude measurement within this disclosure. Principally the measurement procedure is a sequence of $N_{INT}$ cycle integration periods and a following integrator-reset phase. This sequence is running synchronously with the LC-oscillator frequency and phase. Diagram (2) depicts the coil signal after the input multiplexer 19. In this example, the inverted and non-inverted coil signals are drawn. The integrator reset phase is utilized for switching the input multiplexer 19 and coil signal settling. The rectified coil signal is shown in diagram (3). The coil signal integration process is given in diagram (4). After the reset phase, the signal integration starts and is finally captured in the sample-&-hold stage (diagram 4) for conversion. Signal integration and analogue-to-digital conversion within an SAR-ADC are parallel running processes.

LIST OF REFERENCE NUMERALS

1 signal processing unit
2 inductive position sensor
3 first position signal
4 second position signal
5 first input (signal processing unit)
6 second input (signal processing unit)
7 output (signal processing unit)
8 excitation signal
9 oscillator (LCO)
10 signal processor
11 conductive target (moving target)
12 integrator (RC-integrator)
13 analog-to-digital converter (ADC)
14 transmitter coil (excitation coil)
15 first receiver coil (sensor coil)
16 second receiver coil (sensor coil)
17 oscillator controller (Amplitude & Frequency Monitor)
18 digital-to-analog converter (DAC)
19 first multiplexer (input multiplexer)
20 output (first multiplexer)
21 amplifier
22 rectifier
23 test signal generation unit
24 test signal
25 non-inverted signal (first multiplexer)
26 inverted signal (multiplexer)
27 peak detector
28 second multiplexer
29 operational amplifier (peak detector)
30 diode (peak detector)
31 RC low-pass filter (peak detector)
33 capacitor (excitation coil)
34 resistor (excitation coil)
35 analog front-end circuitry (AFE)
36 controller (signal processing unit)
37 gain & offset controller
38 high frequency oscillator (HFO) (digital oscillator)
39 ESD-protection, EMC filter
40 operational amplifier (RC-integrator)
41 resistor (RC-integrator)
42 capacitor (RC-integrator)
43 switch (RC-integrator)
44 input (RC-integrator)
45 output
46 input (peak detector)
47 output (peak detector)
48 phase-delay module
49 FSM sequencer

The invention claimed is:

1. A signal processing unit for an inductive position sensor, wherein the inductive position sensor provides a first position signal and a second phase-shifted position signal, the signal processing unit comprising:

a first input for the first position signal and a second input for the second position signal;

an output for providing an AC excitation signal to the inductive position sensor;

an oscillator connected to the output for generating the AC excitation signal; and a signal processor for calculating the position of a moving target of the position sensor from the first position signal and the second position signal, wherein:

the signal processing unit comprises at least one integrator for integrating an integer number of periods of the first position signal respectively an integer number of periods of the second position signal;

the signal processor calculates the position of the moving target of the position sensor from the integrated first position signal and the integrated second position signal;

the signal processor detects an offset in the integrated first position signal and/or an offset in the integrated second phase-shifted position signal and/or a gain mismatch between the integrated first position signal and the integrated second phase-shifted position signal; and the signal processor provides a corresponding negative compensation signal to the integrator for compensating the detected offset and/or a gain calibration signal for compensating the gain mismatch.

2. The signal processing unit according to claim 1, wherein:

the first position signal and the second phase-shifted position signal are analog signals; and the signal processing unit comprises an analog-to-digital converter for converting the first position signal and the second position signal to a corresponding first digital position signal and to a corresponding second phase-shifted digital position signal.

3. The signal processing unit according to claim 1, further comprising an oscillator controller for keeping the amplitude of the AC excitation signal in a predefined range.

4. The signal processing unit according to claim 1, wherein the inductive position sensor comprises at least one transmitter coil receiving the AC excitation signal, a first receiver coil providing the first position signal and a second receiver coil providing the second position signal.

5. The signal processing unit according to claim 1, wherein the oscillator comprises an LC-oscillator.

6. The signal processing unit according to claim 5, wherein the oscillator comprises a current-driven or current-limited cross-coupled inverter circuitry.

7. The signal processing unit according to claim 1, wherein the negative compensation signal or gain calibration signal is converted from a digital signal to an analog signal by a digital-to-analog converter, particularly to a negative analog signal.

8. The signal processing unit according to claim 1, wherein the signal processing unit provides low-pass filtering and calibration.

9. The signal processing unit according to claim 1, wherein the first input and the second input are connected to a first multiplexer.

10. The signal processing unit according to claim 9, wherein the first input and the second input are connected to an amplifier and/or rectifier.

11. The signal processing unit according to claim 9, wherein an output of the first multiplexer is connected to an amplifier and/or rectifier.

12. The signal processing unit according to claim 9, wherein the signal processing unit comprises a test signal generation unit for providing a test signal to the first multiplexer, wherein the test signal can have a variety of scaling factors.

13. The signal processing unit according to claim 9, wherein the first multiplexer provides a non-inverted signal and an inverted signal for each input.

14. The signal processing unit according to claim 9, wherein the signal processor applies a pseudo-synchronized interleafed sampling method to the multiplexed and integrated first position signal and second phase-shifted position signal.

15. The signal processing unit according to claim 9, further comprising a peak detector for detecting the amplitude of the AC excitation signal provided to the output and a second multiplexer prior to the signal processor, wherein the AC excitation signal provided to the output is additionally provided to the first multiplexer and the signal processor compares the amplitude of the processed AC excitation signal provided to the first multiplexer with the detected amplitude of the peak detector provided to the second multiplexer.

16. The signal processing unit according to claim 15, wherein the peak detector comprises an operational amplifier, a diode and an RC low-pass filter.

17. The signal processing unit according to claim 1, wherein the first position signal comprises a sine position signal and the second phase-shifted position signal comprises a cosine position signal.

* * * * *